(12) United States Patent
Inoue

(10) Patent No.: US 7,875,927 B2
(45) Date of Patent: Jan. 25, 2011

(54) SEMICONDUCTOR DEVICE INCLUDING CAPACITOR ELEMENT AND METHOD OF MANUFACTURING THE SAME

(75) Inventor: Ken Inoue, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/379,764

(22) Filed: Feb. 27, 2009

(65) Prior Publication Data
US 2009/0242980 A1 Oct. 1, 2009

(30) Foreign Application Priority Data
Mar. 25, 2008 (JP) .............. 2008-078632

(51) Int. Cl.
*H01L 29/66* (2006.01)
(52) U.S. Cl. .............. 257/330; 257/331; 257/332; 257/334; 257/E27.06
(58) Field of Classification Search .............. 257/330, 257/331, 332, 334, E27.06
See application file for complete search history.

(56) References Cited
U.S. PATENT DOCUMENTS
2005/0212038 A1  9/2005  Fujiwaru
2007/0082440 A1  4/2007  Shiratake
2007/0096204 A1  5/2007  Shiratake
2007/0264769 A1*  11/2007  Lee et al. .............. 438/239
2008/0227253 A1*  9/2008  Ogawa et al. .............. 438/253

FOREIGN PATENT DOCUMENTS

| JP | 2002-261256 | 9/2002 |
| JP | 2005-285980 | 10/2005 |
| JP | 2007-123551 | 5/2007 |
| JP | 2007-134674 | 5/2007 |

* cited by examiner

*Primary Examiner*—Tan N Tran
(74) *Attorney, Agent, or Firm*—McGinn IP Law Group, PLLC

(57) ABSTRACT

In a semiconductor device, a memory region and a logic region are provided on one silicon substrate. A trench is provided in the silicon substrate in the memory region, a memory cell transistor is provided in the memory region and a logic transistor is provided in the logic region. The memory cell transistor includes a first gate electrode constituted by a metal material. The first gate electrode is provided to be buried in the trench and to protrude outside of the trench. The logic transistor includes a second gate electrode constituted by same material as the metal material constituting the first gate electrode.

17 Claims, 7 Drawing Sheets

SEMICONDUCTOR DEVICE INCLUDING CAPACITOR ELEMENT AND METHOD OF MANUFACTURING THE SAME

This application is based on Japanese patent application NO. 2008-078632, the content of which is incorporated herein by reference.

BACKGROUND

1. Technical Field

The present invention relates to semiconductor device and a manufacturing method thereof. Specifically, it relates to a semiconductor device including a capacitor element.

2. Related Art

When a memory region and a logic region are to be formed on one semiconductor substrate of a semiconductor device, application of a trench gate type gate electrode structure to the semiconductor device is considered to secure a channel length while making word lines (gate electrodes) smaller as disclosed in Japanese Laid-open patent publications NOs. 2002-261256, 2007-134674 and 2007-123551.

In a device disclosed in Japanese Laid-open patent publication NO. 2002-261256, a polysilicon film is used as word lines in a DRAM (Dynamic Random Access Memory) region and a logic region. Furthermore, trenches are formed only in the DRAM region, the word lines in the DRAM region are formed within the trenches and an upper surface of the DRAM region is retreated inward of an upper surface of a substrate.

Japanese Laid-open patent publication NO. 2007-134674 discloses a method of forming N type trench gate transistors in a memory cell region included in a memory region and of forming N type and P type planer transistors in N type and P type peripheral circuit regions, respectively. Specifically, an undoped silicon film is formed as a conductive protection film on a gate insulating film in the N type and P type peripheral circuit regions and a silicon nitride film is formed on this protection film. Using the silicon nitride film as a mask, gate trenches are formed in the memory cell region and a phosphorus-doped amorphous silicon film is formed on an entire surface including within the trenches. Using the silicon nitride film as a mask, a chemical mechanical polishing (CMP) and etch-back are carried out, thus burying the phosphorus-doped amorphous silicon film into the gate trenches. Thereafter, an undoped amorphous silicon film is formed on the entire surface, boron ions are selectively implanted into the P type peripheral circuit region and phosphorus ions are selectively implanted into the memory region and the N type peripheral circuit region.

As can be seen, according to the above-stated method, the protection film is provided on the gate insulating film under the silicon nitride film that serves as a mask layer for forming the gate trenches in the P type and N type peripheral circuit regions. After forming the gate trenches, the impurity-doped amorphous silicon film is formed into the gate trenches without removing the mask layer and the mask layer for forming the gate trenches is then removed. According to Japanese Laid-open patent publication NO. 2007-134674, the mask layer is removed after the doped amorphous silicon film is formed to be buried into the gate trenches. It is, therefore, possible for the protection film formed in advance to prevent damage to the gate insulating film. It is also possible to appropriately set an internal impurity concentration of a silicon layer of each gate electrode without damaging the gate insulating film in the peripheral circuit region.

Japanese Laid-open patent publication NO. 2007-123551 discloses the following technique about gate insulating films for transistors formed in a memory region and a peripheral circuit region. Since transistors to be formed in the peripheral circuit region operate at low voltage, it is necessary to make the gate oxide film thin in the peripheral circuit region. On the other hand, since boosted voltage is applied to transistors to be formed in the memory region, it is necessary to ensure high withstand voltage, that is, it is necessary to make a gate insulating film thick in the memory region.

To meet the necessity, Japanese Laid-open patent publication NO. 2007-123551 discloses a method of forming a thin oxide film that serves as a gate insulating film of planar transistors on a semiconductor substrate in the peripheral circuit region, forming gate trenches in the memory region while covering the thin oxide film with an amorphous silicon film and forming a thicker gate insulating film than the gate insulating film in the peripheral circuit region on inner walls of the gate trenches. With the method disclosed in Japanese Laid-open patent publication NO. 2007-123551, since the amorphous silicon film functions as a protection film preventing growth of the gate insulating film, it is possible to provide the thick gate insulating film while providing the thin gate insulating film in the peripheral circuit region.

Moreover, although different in technical field, Japanese Laid-open patent publication NO. 2005-285980 discloses a technique related to a transistor having a recess structure. Specifically, Japanese Laid-open patent publication NO. 2005-285980 discloses a MOS (Metal Oxide Semiconductor) field effect transistor (FET) (MOSFET) having an elevated source-drain structure. In this MOSFET, gate electrodes made of such metal as tungsten are buried in a semiconductor substrate, thus providing the recess structure.

However, according to studies of the inventor of the present invention, the conventional semiconductor device having the memory region and the logic region formed on the semiconductor substrate has the following problems to be solved so as to stably form transistors excellent as transistors in each of the memory and logic regions.

Namely, according to Japanese Laid-open patent publications NOs. 2002-261256, 2007-134674 and 2007-123551, gate electrodes for the transistors in each region are formed out of polysilicon. Due to this, as already stated above with reference to Japanese Laid-open patent publication NO. 2007-134674, it is necessary to form N+ polysilicon and P+ polysilicon by ion implantation into polysilicon after gate etching so as to form gate electrodes of conduction types in the N type and P type peripheral circuit regions, respectively. Furthermore, if trenches are formed in the memory region, polysilicon in upper portions of the trenches are substantially made thick. Since no ion implantation method is known for simultaneously forming polysilicon in the memory region as well as the other portions (such as a diffusion layer and gates in the logic region). Due to this, procedures of the method are such that after polysilicon outside of the trenches is removed, polysilicon is formed again. This makes manufacturing steps complicated and it leaves much room for improvement in stability of manufacturing of transistors. Specifically, because of irregularities in finished trench depth, ion implantation dose is irregular in depth direction. As a result, such problems as impurities penetration in the gate insulating film and depletion of the gate electrodes disadvantageously occur. Moreover, because of separate ion implantation for P+ polysilicon and N+ polysilicon, the number of steps increases, manufacturing stability is poor, and sufficiently high process reproducibility and mass productivity cannot be ensured. These problems are more conspicuous as scale-down and high integration progress.

SUMMARY

In one embodiment, there is provided a semiconductor device having a memory region and a logic region formed on a substrate, wherein a trench recess is provided in the substrate in the memory region, a first transistor is provided in the memory region and a second transistor is provided in the logic region, the first transistor includes a first gate electrode constituted by a metal material, the first gate electrode is provided to be buried in the recess and to protrude to an outside of the recess, and the second transistor includes a second gate electrode constituted by same material as the metal material constituting the first electrode.

In another embodiment, there is provided a method of manufacturing a semiconductor device including:

forming a first transistor constituting a memory region and a second transistor constituting a logic region on an element formation surface of a substrate, wherein forming the first transistor and the second transistor includes:

selectively removing a predetermined region of the substrate in the memory region to form a trench recess;

forming a metal film in an upper portion of the substrate throughout the memory region and the logic region to bury the recess;

working the metal film into a predetermined shape, thereby forming a first gate electrode in the memory region and a second gate electrode in the logic region; and injecting an impurity into neighborhoods of a surface of the substrate, thereby forming a first impurity diffusion region laterally to the first gate electrode and a second impurity diffusion region laterally to the second gate electrode, and wherein forming the first gate electrode and the second gate electrode includes forming the first gate electrode to be buried in the memory region and to protrude outside of the recess in the memory region.

According to the embodiments of the present invention, the first and second gate electrodes are made of the same metal material and the memory region is configured so that the first gate electrode is provided to be buried in the trench recess and to protrude outside of the recess. Due to this, even if transistors of predetermined conduction types are to be formed in the memory region and the logic region, respectively, it is possible to enhance performances of the transistors in the respective regions.

In the present invention, the film made of the metal material (metal film) means a film made of a material other than polysilicon. Specific examples of the film include a film made of metal such as a tungsten (W) film and a metal nitride film such as a TiN film.

As stated so far, according to the present invention, it is possible to stably form transistors excellent in performances as transistors in each region of a semiconductor device having a memory region and a logic region formed on a substrate.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be described hereinafter with reference to the accompanying drawings. In all the drawings, common constituent elements are denoted by the same reference symbols and are not repeatedly described.

FIRST EMBODIMENT

Figure 1:
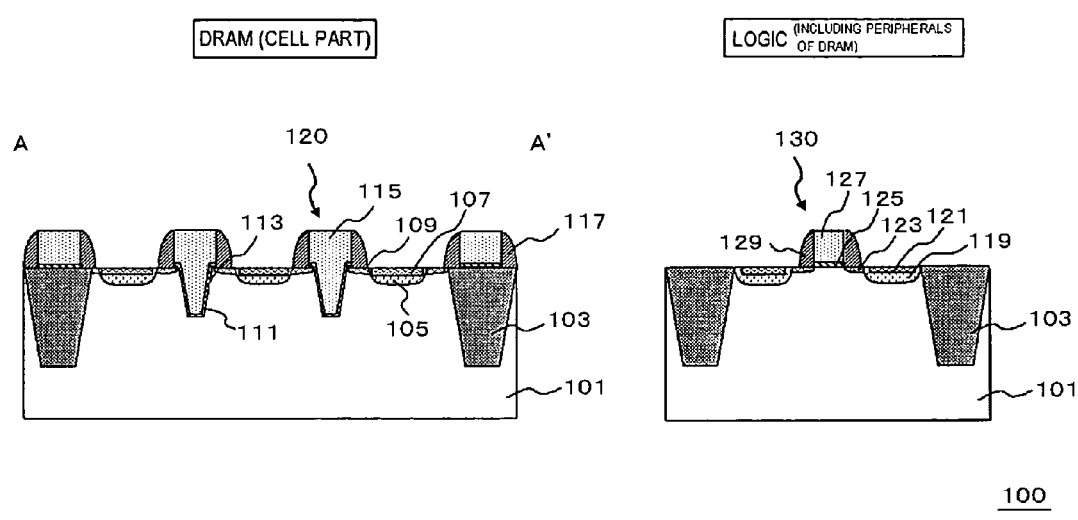
FIG. 1 is a cross-sectional view showing a configuration of a semiconductor device according to an embodiment of the present invention.
Figure 2:
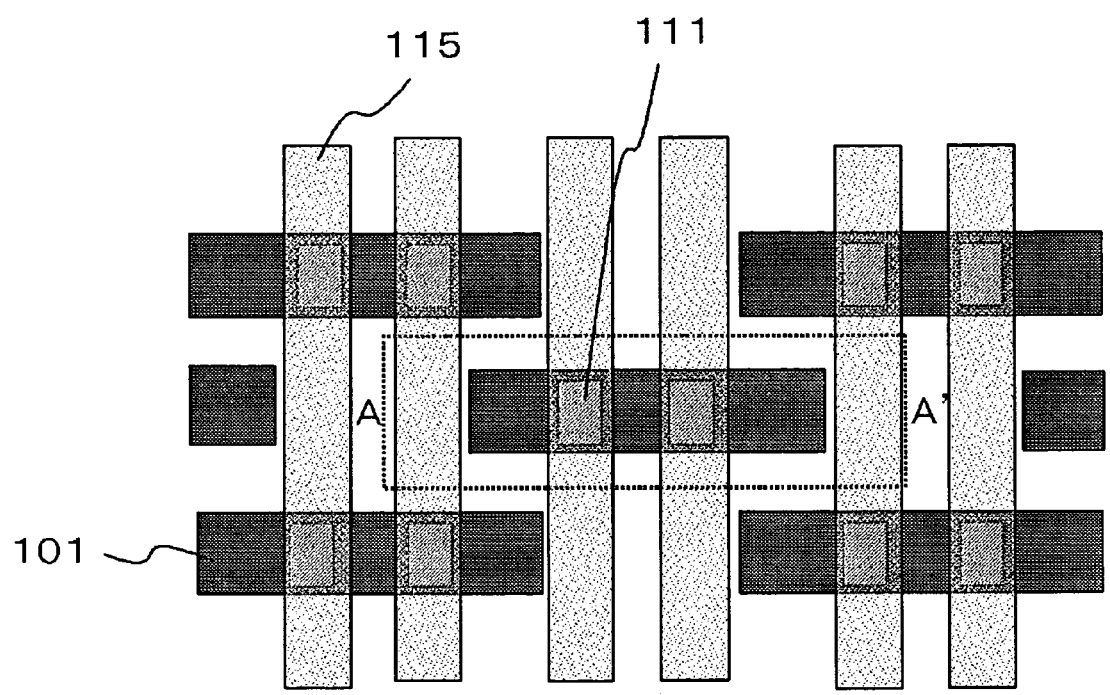
FIG. 2 is a plan view showing a configuration of a memory region of the semiconductor device shown in FIG. 1.

FIG. 1 is a cross-sectional view showing a configuration of a semiconductor device according to a first embodiment of the present invention. FIG. 2 is a plan view showing a configuration of a memory region (DRAM (cell part)) of a semiconductor device 100 shown in FIG. 1. A left view of FIG. 1 corresponds to a cross-sectional view taken along a line A-A' of FIG. 2. Out of two cross-sectional views shown in FIG. 1, the left view is a cross-sectional view in a direction (gate length direction) perpendicular to word lines of the memory region and a right view is a cross-sectional view of a logic region in the gate length direction. Two types of these cross-sectional views are also shown in each of FIGS. 3A to 3D and 5 to 7C.

The semiconductor device 100 shown in FIG. 1 is a device having the memory region (DRAM (cell part)) and the logic region formed on a substrate. The semiconductor device 100 is an embedded DRAM device. First transistors (memory cell transistors) 120 are provided in the memory region whereas second transistors (logic transistors) 130 are provided in the logic region.

The memory region may include a memory cell region in which the memory cell transistors 120 are provided and a peripheral circuit region provided outside of the memory cell region and including third transistors. The peripheral circuits of the memory region include, for example, a decoder, sense amplifiers, I/O circuits and the like. In this case, a third gate electrode constituting each third transistor has an identical cross-sectional structure in the gate length direction to that of a second gate electrode 120 of each logic transistor 130 provided in the logic region.

In the memory region of the semiconductor device 100, trench recesses (trenches) 111 are formed in a substrate (semiconductor substrate such as a silicon substrate 101. Each memory cell transistor 120 includes a first gate electrode 115 made of a metal material. The first gate electrode 115 is provided to be buried in each trench 111 and to protrude outside of the trench 111.

Furthermore, each memory cell transistor 120 includes a first gate insulating film 113 provided between the silicon substrate 101 and the first gate electrode 115, and low concentration impurity diffusion regions (extension regions) 109 and high concentration impurity diffusion regions (source-drain regions) 105 provided on both sides of the first gate electrode 115. The source-drain regions 105 and the extension regions 109 are formed only in a region sufficiently shallower than the trenches 111, thereby sufficiently ensuring a channel length of each memory cell transistor 120. In a formation region in which each of the source-drain regions 105 is formed, an upper portion of the silicon substrate 101 is silicided into a silicide layer 107.

Each logic transistor 130 includes the second gate electrode 127 made of the same material as that of the first gate electrode 115. In this embodiment, each of the first gate electrodes 115 and the second gate electrodes 127 is constituted by a multilayer body of a tungsten (W) film (an upper layer) and a TiN film (a lower layer (substrate side)). It is to be noted that the TiN film acts as work function metal with respect to a barrier layer between the tungsten film and the gate insulating film and a High-k gate insulating film. The trenches 111 are formed in respective electrode formation regions and a gate electrode film is not necessarily a multi-layer film of the tungsten film and the TiN film. The gate electrode film may be a combination of a metal film and a metal nitride film or the like. In FIG. 1, each of the second gate electrodes 127 in the logic region 130 is not buried in a trench but is a planar gate electrode.

Furthermore, each logic transistor 130 includes a second gate insulating film 125 provided between the silicon substrate 101 and the second gate electrode 127, and low concentration impurity diffusion regions (extension regions) 123 and high concentration impurity diffusion regions (source-drain regions) 119 provided in the silicon substrate 101 on both sides of the second gate electrode 127. In a formation region in which each of the source-drain regions 119 is formed, an upper portion of the silicon substrate 101 is silicided into a silicide layer 121.

It is to be noted that the first gate electrode 113 and the second gate electrode 125 may be made of either the same material or different materials.

Figure 3A:
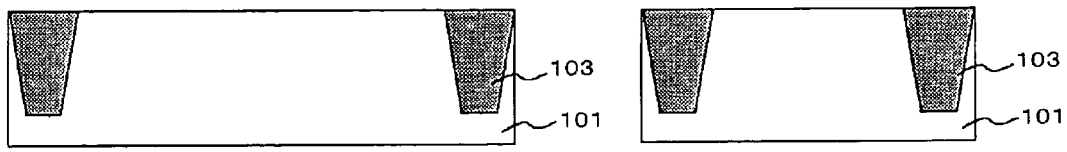
FIGS. 3A to 3D are cross-sectional views showing steps of manufacturing the semiconductor device shown in FIG. 1.
Figure 3B:
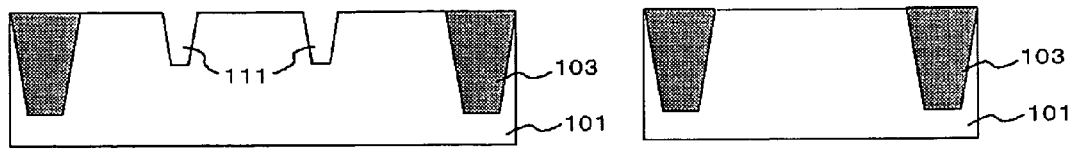
Figure 3C:
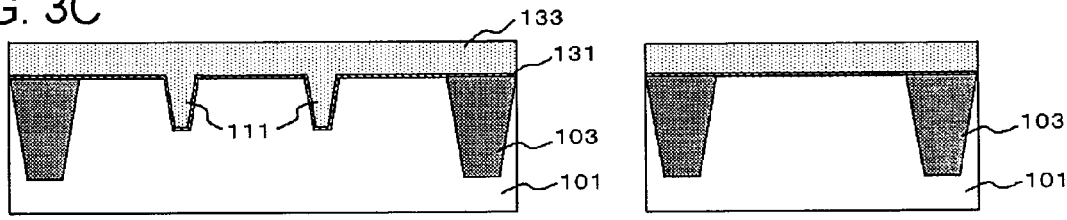
Figure 3D:
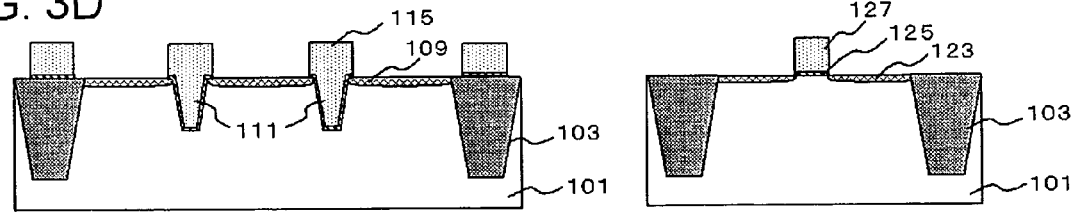
Figure 4A:
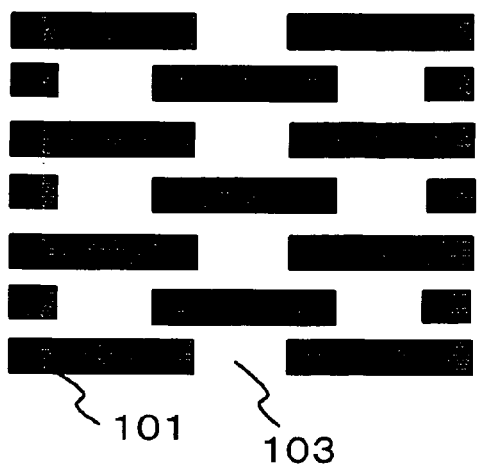
FIGS. 4A to 4C are plan views showing the steps of manufacturing the memory region of the semiconductor device shown in FIG. 1.
Figure 4B:
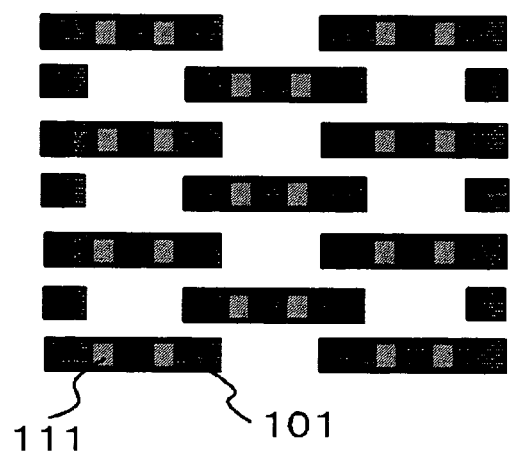
Figure 4C:
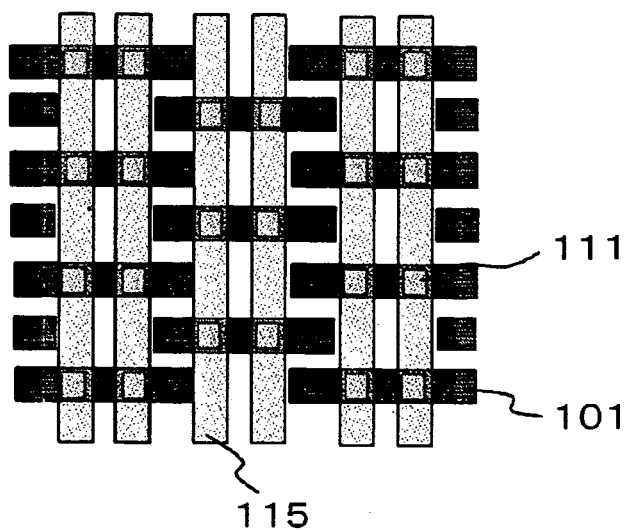

Referring to FIGS. 3A to 3D and 4A to 4C, a method of manufacturing the semiconductor device 100 will be described. FIGS. 3A to 3D are cross-sectional views showing steps of manufacturing the semiconductor device 100. FIGS. 4A to 4C are plan views showing the steps of manufacturing the memory region of the semiconductor device 100.

The method of manufacturing the semiconductor device 100 according to this embodiment includes the following step.

Step 11: Forming the memory cell transistors 120 constituting the memory region and the logic transistors 130 constituting the logic region on an element formation surface of the silicon substrate 101.

The step 11 specifically includes the following step.

Step 12: Selectively removing predetermined regions on the silicon substrate 101 and forming the trench recesses (trenches) 111 in the memory region;

Step 13: Forming a metal film (a tungsten film) 133 in the upper portion of the silicon substrate 101 throughout the memory region and the logic region so as to bury the trenches 111;

Step 14: Working the metal film 133 into a predetermined shape to form the first gate electrodes 115 in the memory region and to form the second gate electrodes 127 in the logic region; and Step 15: Introducing impurities into neighborhoods of the surface of the silicon substrate 101 to form the first impurity diffusion regions (source-drain regions) 105 on the sides of the first gate electrodes 115 and to form the second impurity diffusion regions (source-drain regions) 119 on the sides of the second gate electrodes 127.

In these procedures, in the step 14 of forming the first gate electrodes 115 and the second gate electrodes 127, the first gate electrodes 115 are formed to be buried in the trenches 111 in the memory region and to protrude to outsides of the trenches 111. Furthermore, in this embodiment, after the step 14 of forming the first gate electrodes 115 and the second gate electrodes 127, the step 15 of forming the source-drain regions 105 and 119 is executed. The method of manufacturing the semiconductor device 100 will now be described more specifically.

First, as shown in FIGS. 3A and 4A, element isolation regions 103 are formed at predetermined positions of the element formation surface of the silicon substrate 101, respectively by, for example, STI (Shallow Trench Isolation). Further, the silicon substrate 101 is selectively removed in regions in which the first gate electrodes 115 are formed in the memory region, thereby forming the trench recesses (trenches) 111 (FIGS. 3B and 4B).

Next, after forming a high-dielectric constant film 131 entirely on the element formation surface of the silicon substrate 101 in which the trenches 111 are formed, a TiN film (not shown) is formed to bury the trenches 111 and the tungsten film 133 is formed on the TiN film (FIG. 3C).

The high-dielectric constant film 131 is a film worked in a later step into a gate insulating film. Since the high-dielectric constant film 131 is a film higher in a dielectric constant than silicon oxide, a so-called high-k film can be used as the high-dielectric constant film 131. The high-dielectric constant film 131 can be constituted out of a material having a relative dielectric constant of 6 or higher. Specifically, the high-dielectric constant film 131 can be formed out of a material containing one or more metal elements selected from among a group consisting of Hf and Zr and can be formed as an oxide film, a silicate film or the like containing at least one of these metal elements.

Furthermore, the tungsten film 133 is formed by, for example, Chemical Vapor Deposition (CVD) or Atomic Layer Deposition (ALD).

A mask covering regions in which the first gate electrodes 115 and the second gate electrodes 127 are formed is created. The tungsten film 133, the TiN film (not shown) and the high-dielectric constant film 131 are worked into predetermined shapes. A multilayer body of the first gate electrodes 115 and the first gate insulating film 113 is formed in the memory region (FIG. 4C) and a multilayer body of the second gate electrodes 127 and the second gate insulating film 125 is formed in the logic region.

Thereafter, impurity ions of predetermined conductions are implanted into the silicon substrate 101 in regions in which the memory cell transistors 120 and the logic transistors 130 are formed, respectively, thereby forming the extension regions 109 and 123 (FIG. 3D). An insulating film such as a silicon oxide film is formed entirely on the element formation surface of the silicon substrate 101 and worked into a predetermined shape, thereby forming sidewall insulating films 117 and 129 on sides of the first gate electrodes 115 and sides of the second gate electrodes 127, respectively. Next, the source-drain regions 105 and the source-drain regions 119 are formed as high-concentration impurity diffused regions deeper than the extension regions 109 and 123, respectively and shallower than the trenches 111 by ion implantation.

Through these procedures, the semiconductor device 100 shown in FIG. 1 is obtained. Alternatively, predetermined elements may be further formed and/or an interconnect layer and an insulating interlayer may be formed in the upper portion of the silicon substrate 101.

Functions and advantages of this embodiment will be described.

In this embodiment, the material of the first gate electrodes 115 is the same as that of the second gate electrodes 127, that is, the material is the metal (the tungsten). Since the first gate electrodes 115 formed out of the tungsten film are buried in the trenches 111, a cell size of the memory cell transistors 120 can be reduced. Even if the cell size of the memory cell transistors 120 is small, an effective channel length can be sufficiently secured. Therefore, an increase in a leakage current (such as an off-current (IOFF) or a junction leakage current) in the memory cell transistors 120 can be suppressed. Furthermore, holding characteristics of the memory cell transistors 120 can be improved. Due to this, even if the memory region and the logic region are formed on one silicon substrate 101, it is possible to ensure that both the memory cell transistors 120 and the logic transistors 130 have excellent performances. This function and advantage are conspicuous in a configuration in which a bottom surface of each of the first gate electrodes 115 is located in the silicon substrate 101 inward of the source-drain regions 105.

In Japanese Laid-open patent publication NO. 2005-285980, the metal gate recess structure is described. With this configuration described in Japanese Laid-open patent publication NO. 2005-285980, however, if a gate length of each transistor is reduced, it is necessary to increase a channel dose to deal with short channels. This results in an increase in an IOFF or a junction leakage current of the transistors. According to this embodiment, by contrast, even if the gate width is reduced similarly to Japanese Laid-open patent publication NO. 2005-285980, the effective channel length can be increased by the recess structure, thereby making it possible to reduce a channel dose. As a consequence, the junction leakage current can be reduced, the holding characteristics can be improved, and threshold irregularity resulting from a fluctuation in impurity concentration can be reduced, thereby realizing high performance and high reliability.

Moreover, in this embodiment, the first gate electrode 115 protrude in a surface direction of the silicon substrate outside of the trenches 111, and an edge portion of the first gate electrode 115 covers an opening of trench 111. By causing the first gate electrode 115 to protrude, it is possible to protect the gate insulating film in the trenches (trench sidewalls in particular) from being exposed to a gate etching gas during working gate electrodes or exposed to plasma during removal of a resist. Manufacturing stability and transistor reliability can be thereby improved. It is, therefore, possible to further enhance a manufacturing stability of the first gate electrodes 115.

Furthermore, in this embodiment, the first gate electrodes 115 and the second gate electrodes 127 can be worked into gate electrode shapes in the same step and a height of the first gate electrodes 115 from the surface of the silicon substrate 101 can be made identical to that of the second gate electrodes 127. It is, therefore, possible to suppress formation of stepped portions between the memory region and the logic region and thereby improve the manufacturing stability at the time of forming upper layers than the gate electrodes 115 and 127.

Moreover, in this embodiment, the silicide layer 121 is provided in upper portions of the source-drain regions 119 provided in the logic region. Besides, the silicide layer 107 is provided in upper portions of the source-drain regions 105 provided in the memory region. It is thereby possible to reduce a resistance in the upper portions of the source-drain regions 105 of the memory cell transistors 120 more effectively and further improve characteristics of the memory cell transistors 120.

Differences from the first embodiment will be mainly described below.

SECOND EMBODIMENT

Figure 5:
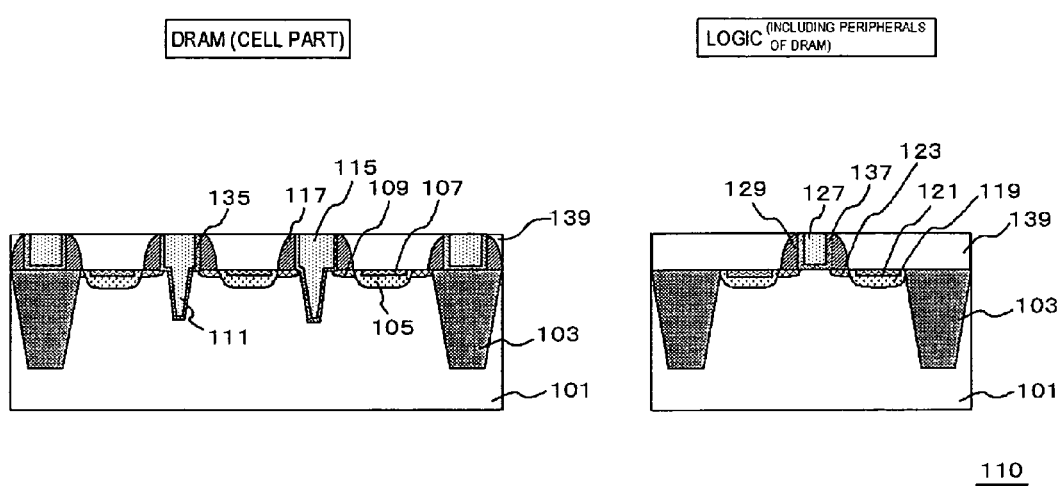
FIG. 5 is a cross-sectional view showing a configuration of a semiconductor device according to another embodiment of the present invention.

FIG. 5 is a cross-sectional view showing a configuration of a semiconductor device 110 according to a second embodiment of the present invention. The semiconductor device 110 is similar in basic configuration to the semiconductor device 100 according to the first embodiment (FIGS. 1 and 2) but different from the semiconductor device 100 in that a gate insulating film of transistors in a memory region and a logic region is provided in a range from a region between a silicon substrate 101 and bottoms of gate electrodes to a region between side surfaces of the gate electrodes and a sidewall insulating film.

Namely, a first gate insulating film 135 and a second gate insulating film 137 are provided in the semiconductor device 110 in place of the first gate insulating film 113 and the second gate insulating film 125 provided in the semiconductor device 100, respectively. An upper end of the first gate insulating film 135 coincides with upper surfaces of first gate electrodes 115 and an upper end of the second gate insulating film 137 coincides with upper surfaces of second gate electrodes 127. In this embodiment, similarly to the first embodiment, the upper surfaces of the first gate electrodes 115 are flush with those of the second gate electrodes 127. A silicon oxide film 139 is provided on an element formation surface of the silicon substrate 101. An upper surface of the silicon oxide film 139 is flush with the upper surfaces of the first gate electrodes 115 and the second gate electrodes 127. The first gate electrodes 115 and the second gate electrodes 127 are buried in the silicon oxide film 139.

Next, a method of manufacturing the semiconductor device 101 will be described. In this embodiment, differently from the first embodiment, a step 15 of forming source-drain regions 105 and source-drain regions 119 is executed before the step 14 of forming the first gate electrodes 115 and the second gate electrodes 127.

Further, in this embodiment, after dummy gate electrode structures to be removed in a later step are formed on the silicon substrate 101 and the source-drain regions 105 and 119 are formed, an entire surface of the element formation surface of the silicon substrate 101 is covered with an insulating film. Using the insulating film as a mask, the dummy gate electrode structures are removed and trenches 111 are formed in regions in which the dummy gate electrode structures are removed.

In this embodiment, a step 11 of forming memory cell transistors 120 and logic transistors 130 includes the following steps.

Step 16: Forming first sacrificial gate electrodes (first dummy gate electrodes) 143 on an upper surface of the silicon substrate 101 in the memory region and second sacrificial gate electrodes (second dummy gate electrodes) 153 on the upper surface of the silicon substrate 101 in the logic region;

Step 17: Forming a first sidewall insulating film 117 and a second sidewall insulating film (sidewall insulating films) 129 covering sidewalls of a first dummy gate insulating film 141 and a second dummy gate insulating film 151, respectively on the silicon substrate 101;

Step 18: Forming an insulating film (a silicon oxide film) 139 covering the sidewall insulating films 117 and 129 on the element formation surface of the silicon substrate 101; and Step 19: Selectively removing the first dummy gate electrodes 143 and the second dummy gate electrodes 153 after the step 18 of forming the silicon oxide film 139, thereby exposing the element formation surface of the silicon substrate 101.

Moreover, in this embodiment, a step 15 of forming source-drain regions 105 and source-drain regions 119 is executed after the step 16 of forming the first dummy gate electrodes 143 and the second dummy gate electrodes 153 and before the step 18 of forming the silicon oxide film 139. Further, a step 12 of forming the trenches 111 is executed after the step 19 of selectively removing the first dummy gate electrodes 143 and the second dummy gate electrodes 153.

Referring to FIGS. 6A to 6C and 7A to 7C, the method of manufacturing the semiconductor device 110 will be further described. FIGS. 6A to 6C and 7A to 7C are cross-sectional views showing the steps of manufacturing the semiconductor device 110.

Figure 6A:
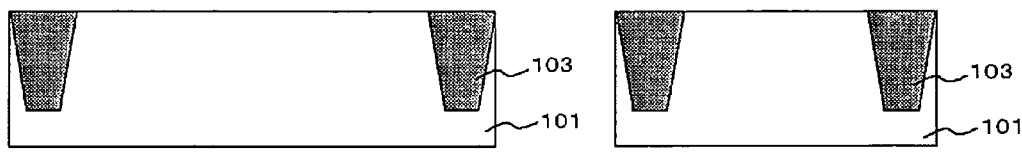
FIGS. 6A to 6C are cross-sectional views showing steps of manufacturing the semiconductor device shown in FIG. 5.

First, similarly to the first embodiment, element isolation regions 103 are formed at predetermined positions of the element formation surface of the silicon substrate 101 in the memory region and the logic region, respectively (FIG. 6A). Next, first dummy electrode structures each including the first dummy gate insulating film 141 and one first dummy gate electrode 143 are formed at predetermined positions in the memory region, respectively. In addition, second dummy electrode structures each including the second dummy gate insulating film 151 and one second dummy gate electrode 153 are formed at predetermined positions in the logic region, respectively.

The first dummy gate insulating film 141 and the second dummy insulating film 151 are formed in the same step and made of the same material. Further, the first dummy gate electrodes 143 and the second dummy gate electrodes 153 are formed in the same step and made of the same material. The materials of these first and second dummy insulating films 141 and 151 and the first and second dummy gate electrodes 143 and 153 are not limited to specific materials. Examples of materials of the first and second dummy insulating films 141 and 151 include silicon oxide and a high-dielectric constant material. Examples of materials of the first and second dummy gate electrodes 143 and 153 include silicon nitride (for an upper layer) and amorphous silicon (for a lower layer (substrate side)).

Figure 6B:
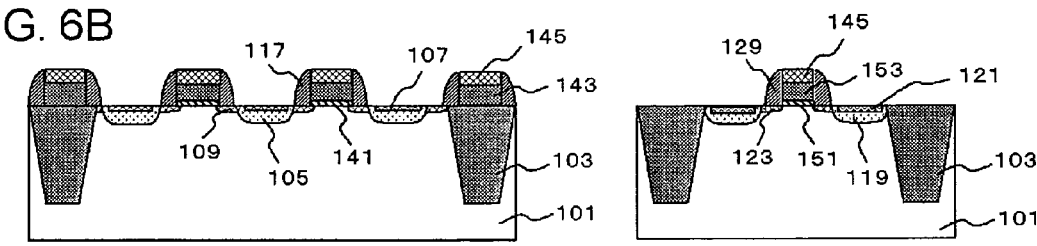

Similarly to the method described above with reference to FIGS. 3D and 1 according to the first embodiment, extension regions 109 are formed in the memory region and extension regions 123 are formed in the logic region. An insulating film such as a silicon oxide film is formed on an entire surface of the silicon substrate 101 and worked into a predetermined shape, thereby forming a sidewall insulating film 117 covering sidewalls of the first and second dummy electrode structures and a sidewall insulating film 129 covering sidewalls of the second dummy gate electrodes 153. Thereafter, the source-drain regions 105 are formed in the memory region and the source-drain regions 119 are formed in the logic region. Next, the element formation surface of the silicon substrate 101 is silicided to form silicide layers 107 and 121 (FIG. 6B)

Figure 6C:
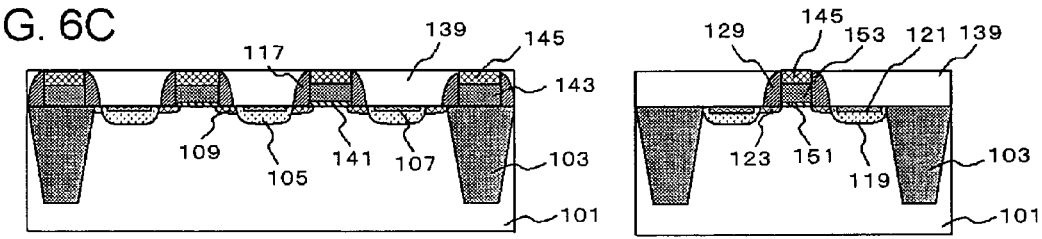

After forming a silicon oxide film 139 covering the sidewall insulating films 117 and 129 and a silicon nitride film 145 on the entire surface of the silicon substrate 101, CMP or dry etching is carried out, thereby exposing a surface of the silicon nitride film 145 on upper portions of dummy gates (FIG. 6C). In this case, the silicon nitride film 145 is used to serve as an etching mask for a dummy gate pattern, to serve to prevent a silicidation reaction on the dummy gates and to serve as a stopper film during the CMP or dry etching carried out on the silicon oxide film 139. In this embodiment, the silicon nitride film is used by way of example. Alternatively, a film made of the other material may be used as long as the film has film characteristics having the above-stated functions.

Figure 7A:
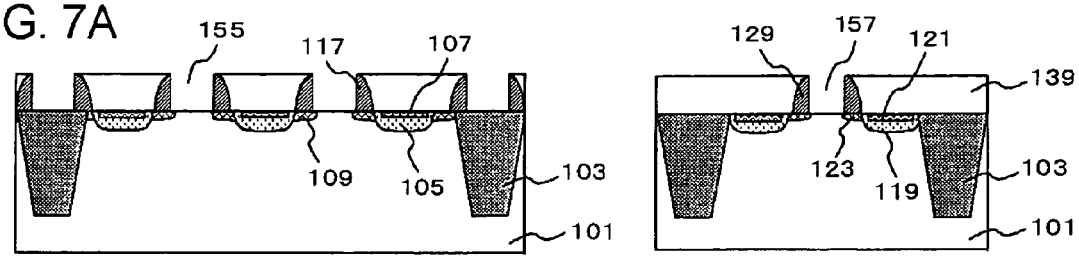
FIGS. 7A to 7C are cross-sectional views showing the steps of manufacturing the semiconductor device shown in FIG. 5.

Next, the silicon nitride film 145, the first dummy gate electrodes 143 and the first dummy gate insulating film 141 buried in the insulating film in the memory region are removed by etching, thereby exposing the surface of the silicon substrate 101 and forming openings 155 (FIG. 7A). This etching is carried out in conditions of high selectivity to the silicon oxide film 139. At this time, the silicon nitride film 145, the second dummy gate electrodes 153 and the second dummy gate insulating film 151 are also removed in the logic region, thereby exposing the surface of the silicon substrate 101 and forming openings 157 (FIG. 7A).

Figure 7B:
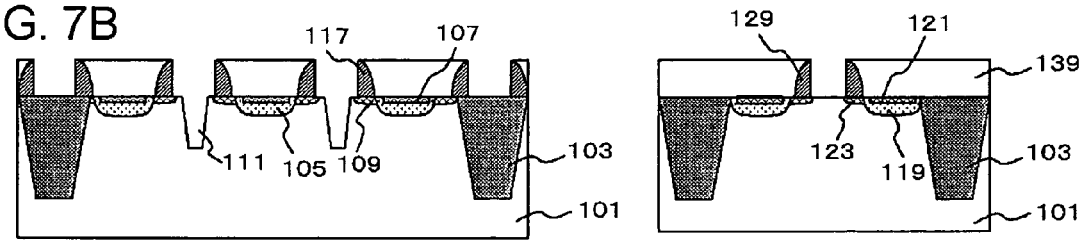

In the logic region, after forming a mask (not shown) covering the openings 157, the silicon substrate 101 is selectively etched using the silicon oxide film 139 as a mask. The trenches 111 are thereby formed at bottoms of the openings 155 (FIG. 7B). In an example shown in FIG. 7B, the trenches 111 are formed to be narrower than the openings 155 in a cross-sectional view in a gate length direction. Further, the trenches 111 are formed to be narrower from the surface of the silicon substrate 101 toward an interior of the trenches 111 in the cross-sectional view in the gate length direction.

Figure 7C:
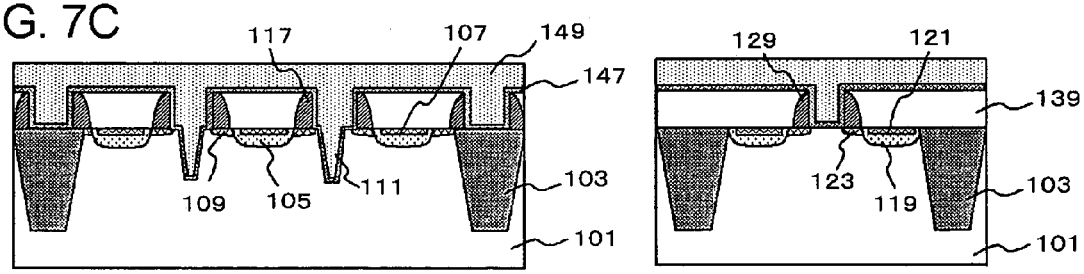

After removing the mask (not shown) covering the openings 157, a high-dielectric constant film 147, a TiN film (not shown) and a metal film (a tungsten film) 149 are sequentially formed on the entire surface of the silicon substrate 101 (FIG. 7C). The high-dielectric constant film 147 is formed to cover inner walls of recesses constituted by the trenches 111 and the openings 155 in the memory region and to cover inner walls of the openings 157 in the logic region.

Thereafter, the tungsten film 149, the TiN film (not shown) and the high-dielectric constant film 147 formed outside of the openings 155 and 157 are removed, thereby forming gate electrode structures in the memory region and the logic region. Through these procedures, the semiconductor device 110 shown in FIG. 5 is obtained.

This embodiment exhibits similar functions and advantages to those of the first embodiment.

Further, in this embodiment, after covering the silicon substrate 101, in which the dummy gate electrode structures are formed, with the silicon oxide film 139, the dummy gate electrode structures are removed and the self-aligned trenches 111 to the silicon oxide film 139 are formed. Due to this, even if a gate length of the first gate electrodes 115 is small, it is possible to further improve working stability and dimensional controllability of the first gate electrodes 115.

The embodiments of the present invention have been described so far. However, the embodiments of the present invention are given for illustrated purposes and various other configurations can be adopted for the present invention.

In the embodiments stated so far, an instance in which the first and second gate electrodes differ in a cross-sectional shape in the gate length direction has been shown. Alternatively, the first and second gate electrodes may be identical in the cross-sectional shape in the gate length direction. In this alternative, in the step of forming the trenches 111 in the memory region, trenches can be formed in the silicon substrate 101 for regions in which the second gate electrodes 127 are formed in the logic region to bury the second gate electrodes in these trenches.

In the embodiments, the instance of forming DRAMs in the memory region has been shown. However, a type of memories to be formed in the memory region is not limited to the DRAM but SRAMs (Static Random Access Memories), for example, may be formed in the memory region.

It is apparent that the present invention is not limited to the above embodiment, and may be modified and changed without departing from the scope and spirit of the invention.

What is claimed is:

1. A semiconductor device comprising a memory region and a logic region formed on a substrate,
    wherein a trench recess is provided in said substrate in said memory region,
    wherein a first transistor is provided in said memory region and a second transistor is provided in said logic region,
    wherein said first transistor includes a first gate electrode comprising a metal material,
    wherein said first gate electrode is provided to be buried in said recess and to protrude to an outside of said recess, and
    wherein said second transistor includes a second gate electrode comprising the same material as the metal material of said first electrode.

2. The semiconductor device according to claim 1, wherein said memory region includes a memory cell region in which said first transistor is provided and a peripheral circuit region provided outside of said memory cell region and including a third transistor, and
    wherein a third gate electrode of said third transistor has an identical cross-sectional structure in a gate length direction to a cross-sectional structure of said second gate electrode.

3. The semiconductor device according to claim 2, wherein said third transistor of the peripheral circuit region is disposed above an element isolation region in said semiconductor device.

4. The semiconductor device according to claim 1, wherein said first gate electrode protrudes in a surface direction of said substrate outside of said recess.

5. The semiconductor device according to claim 1, wherein each of said first gate electrode and said second gate electrode comprises a tungsten film.

6. The semiconductor device according to claim 1, wherein a first impurity diffusion region is provided in said substrate laterally to said first gate electrode in said memory region, and a second impurity diffusion region is provided in said substrate laterally to said second gate electrode in said logic region, and
    wherein a silicide layer is provided in an upper portion of each of said first impurity diffusion region and said second impurity diffusion region.

7. The semiconductor device according to claim 1, wherein a plurality of element isolation regions is embedded in the substrate and isolates said logic region from said memory region.

8. The semiconductor device according to claim 1, further comprising an element isolation region including a trench isolation region placed outside areas below the first transistor and the second transistor.

9. The semiconductor device according to claim 1, further comprising:
    a plurality of impurity diffusion regions provided on both sides of the first gate electrode in a gate length direction of the semiconductor device,
    wherein a silicide layer is provided in an upper portion of an element isolation region of said impurity diffusion regions.

10. The semiconductor device according to claim 1, further comprising:
    a plurality of impurity diffusion regions provided on both sides of the second gate electrode in a gate length direction of the semiconductor device,
    wherein a silicide layer is provided in an upper portion of an element isolation region of said impurity diffusion regions.

11. The semiconductor device according to claim 1, further comprising:
    a plurality of low concentration impurity diffusion regions and a plurality of high concentration impurity diffusion regions provided on both sides of the first gate electrode,
    wherein a silicide layer is provided in an upper portion of an element isolation region of said high impurity diffusion regions.

12. The semiconductor device according to claim 1, further comprising:
    a plurality of low concentration impurity diffusion regions and a plurality of high concentration impurity diffusion regions provided on both sides of the second gate electrode,
    wherein a silicide layer is provided in an upper portion of an element isolation region of said high impurity diffusion regions.

13. The semiconductor device according to claim 1, wherein the second gate electrode comprises a planar gate electrode comprising a lower surface formed above an uppermost surface of the substrate.

14. The semiconductor device according to claim 1, wherein said second transistor comprises a gate insulating film disposed between the substrate and the second gate electrode.

15. A semiconductor device, comprising:
    a memory region formed on a substrate, said memory region comprising:
        a first transistor comprising a first gate electrode having a metal material; and
        a trench recess formed in said substrate, said first gate electrode being buried in said recess and protruding to an outside of said recess;
    a logic region formed on the substrate and comprising a second transistor; and
    a plurality of trench isolation regions which isolates said logic region from said memory region, a trench isolation region of said trench isolation regions being embedded in said substrate outside areas below the first transistor and the second transistor,
    wherein said second transistor includes a second gate electrode having the same material as the metal material of said first electrode.

16. The semiconductor device according to claim 15, wherein a first impurity diffusion region is provided in said substrate laterally to said first gate electrode in said memory region, and a second impurity diffusion region is provided in said substrate laterally to said second gate electrode in said logic region, and wherein a silicide layer is provided in an upper portion of each of said first impurity diffusion region and said second impurity diffusion region.

17. The semiconductor device according to claim 15, wherein low concentration impurity diffusion regions and high concentration impurity diffusion regions are provided on both sides of the first gate electrode, and wherein a silicide layer is provided in an upper portion of each of said high impurity diffusion regions.

* * * * *